(12) United States Patent
Koutani et al.

(10) Patent No.: US 7,482,879 B2
(45) Date of Patent: Jan. 27, 2009

(54) VARIABLE GAIN AMPLIFIER AND COMMUNICATION APPARATUS

(75) Inventors: Masato Koutani, Nara (JP); Kunihiko Iizuka, Sakai (JP); Hiroshi Kawamura, Kashihara (JP)

(73) Assignee: Sharp Kabushiki Kaisha, Osaka-Shi (JP)

( * ) Notice: Subject to any disclaimer, the term of this patent is extended or adjusted under 35 U.S.C. 154(b) by 156 days.

(21) Appl. No.: 11/635,685

(22) Filed: Dec. 8, 2006

(65) Prior Publication Data
US 2007/0222515 A1      Sep. 27, 2007

(30) Foreign Application Priority Data
Mar. 24, 2006    (JP) ............................... 2006-083729

(51) Int. Cl.
*H03F 1/22* (2006.01)
*H03F 3/45* (2006.01)

(52) U.S. Cl. .................. 330/311; 330/254; 330/284

(58) Field of Classification Search ............. 330/254, 330/278, 284, 311; 455/240.1, 250.1
See application file for complete search history.

(56) References Cited

U.S. PATENT DOCUMENTS

| | | | |
|---|---|---|---|
| 6,172,566 B1 * | 1/2001 | Nguyen | ............. 330/254 |
| 6,181,206 B1 | 1/2001 | Palmisano et al. | |
| 7,321,266 B2 * | 1/2008 | Chiang | ............. 330/254 |
| 2003/0181181 A1 | 9/2003 | Darabi | |
| 2005/0208921 A1 | 9/2005 | Roufoogaran | |
| 2005/0221779 A1 | 10/2005 | Okanobu | |

FOREIGN PATENT DOCUMENTS

| | | |
|---|---|---|
| EP | 1528667 A2 | 4/2005 |
| JP | 2005-136846 A | 5/2005 |

OTHER PUBLICATIONS

U.Tietze, C. Schenk. Trigger Circuits1986, XP002419873 Springer-Verlag, Berlin, pp. 162-169, with partial English translation.

* cited by examiner

*Primary Examiner*—Khanh V Nguyen
(74) *Attorney, Agent, or Firm*—Birch, Stewart, Kolasch & Birch, LLP

(57) ABSTRACT

A variable gain amplifier is provided that can obtain a wide range of gain variation and suppress the deterioration of linearity when switching between amplifying transistors. The variable gain amplifier includes a plurality of cascode amplifiers each including an amplifying transistor and a plurality of cascode transistors connected in a cascode arrangement to an output terminal of the amplifying transistor. The plurality of cascode amplifiers are connected through attenuators. The variable gain amplifier further includes a first controller that controls ON/OFF operations of the plurality of cascode transistors included in each cascode amplifier; and a second controller that controls ON/OFF operations of a plurality of amplifying transistors, only one of which is included in each of the plurality of cascode amplifiers, such that only selected one of the plurality of amplifying transistors is turned on.

14 Claims, 13 Drawing Sheets

VARIABLE GAIN AMPLIFIER AND COMMUNICATION APPARATUS

BACKGROUND OF THE INVENTION

1. Field of the Invention

The present invention relates to a variable gain amplifier whose gain is variable, and also to a communication apparatus including therein the amplifier.

2. Description of Related Art

A conventional communication apparatus for, for example, transmitting/receiving television broadcasting signals, includes therein a variable gain amplifier constructed so that its gain is variable. For example, a receiving circuit of the communication apparatus includes therein a low noise amplifier (LNA), as a variable gain amplifier, for amplifying radio frequency (RF) signals received through an antenna.

When a target wave received is weak, the gain of the LNA is set to a large value so that the influence of noise to be generated in each circuit can be suppressed as much as possible and thereby high sensitivity of reception can be obtained. Contrastingly, when an interfering wave exists or the target wave is high in intensity, the gain of the LNA is set to a small value so that a circuit on a subsequent stage, such as a frequency converter, can be prevented from being saturated. For this purpose, the LNA requires a wide range of gain variation, for example, about 30 to 40 dB. Further, in a reception environment in which an interfering wave exists though the target wave is weak, the LNA requires high linearity to suppress the influence of distortion to be generated due to the interfering wave.

The linearity of a general receiving circuit in which a plurality of circuits including the LNA and a mixer, a filter, etc., on the subsequent stages, are in a cascade arrangement, for example, see FIG. 1 in relation to an embodiment of the present invention, is given by the following Expression 1 using IIP3, which is the third-order intermodulation intercept point as an index of linearity.

$$\frac{1}{IIP3} = \frac{1}{IIP3_1} + \frac{G_1}{IIP3_2} + \frac{G_1 \cdot G_2}{IIP3_3} + \ldots + \frac{\prod_{j=1}^{n-1} G_j}{IIP3_n} \quad \text{[Expression 1]}$$

In the Expression 1, $G_1, G_2, \ldots$, and $IIP3_1, IIP3_2$, represent the respective gain and IIP3 of each of the plurality of circuits, including the LNA, and the mixer, filter, etc., in the cascade arrangement. As apparent from the Expression 1, IIP3 of the whole of the receiving circuit is improved as the linearity $IIP3_1$ of the LNA as the first circuit in the receiving circuit increases or the gain $G_1$ of the LNA decreases. Therefore, to keep the linearity of the whole of the receiving circuit high, it is desired that the linearity of the LNA itself does not decrease when the gain of the LNA is gradually decreased.

JP-A-2005-136846 discloses a variable gain amplifier suitable for such an LNA. The variable gain amplifier includes therein a plurality of bipolar transistors, as amplifying transistors, connected in parallel between signal input and output terminals. An attenuator is provided in each interval between the plurality of amplifying transistors so that a signal attenuated by the attenuator is input to the amplifying transistor on the subsequent stage. Further, the base currents of the plurality of amplifying transistors are continuously controlled so that the total of the currents is kept constant. Thus, a gain variation characteristic in which the gain varies smoothly over a wide range can be obtained by switching between the plurality of amplifying transistors different in gain to be obtained, and further by changing the supply current to each amplifying transistor.

In general, the linearity of a circuit is improved as the power consumption of the circuit increases. In the variable gain amplifier of JP-A-2005-136846, however, there is a transition region in which each transistor operates with a little base current because the distribution ratio of base currents changes continuously when the plurality of amplifying transistors are switched over. Thus, as shown in FIG. 4 of JP-A-2005-136846, in particular, when switching from the first-stage amplifying transistor to the second-stage amplifying transistor to decrease gain, the characteristic of the linearity IIP3 drops widely, that is, deteriorates, as the supply current to the first-stage amplifying transistor decreases.

SUMMARY OF THE INVENTION

An object of the present invention is to provide a variable gain amplifier capable of obtaining a wide range of gain variation and suppressing the deterioration of linearity when switching between amplifying transistors.

A variable gain amplifier according to the present invention comprises a plurality of cascode amplifiers each comprising an amplifying transistor that amplifies an input signal, and a plurality of cascode transistors connected in a cascode arrangement to an output terminal of the amplifying transistor. The plurality of cascode amplifiers are connected through attenuators. The variable gain amplifier further comprises a first controller that controls ON/OFF operations of the plurality of cascode transistors included in each cascode amplifier; and a second controller that controls ON/OFF operations of a plurality of amplifying transistors, only one of which is included in each of the plurality of cascode amplifiers, such that only selected one of the plurality of amplifying transistors is turned on.

Because the plurality of cascode amplifiers are connected through the attenuators, a signal stepwise attenuated more is input to the amplifying transistor of the later-stage cascode amplifier. In addition, each amplifier includes the cascode transistors connected in a cascode arrangement to the output terminal of the amplifying transistor. Therefore, by switching over between the plurality of amplifying transistors and controlling the ON/OFF operations of the plurality of cascode transistors by the first controller to change the quantity of a signal amplified by the amplifying transistor to flow in a signal transmission path connected to a signal output terminal, the gain can be finely changed in a wide range.

In addition, in the variable gain amplifier of the present invention, the second controller controls the ON/OFF operations of the plurality of amplifying transistors such that only selected one amplifying transistor is turned on, and thereby a constant current flows only in the amplifying transistor of selected one cascode amplifier. Therefore, currents never flow simultaneously in a plurality of amplifying transistors when switching over the cascode amplifier. In addition, there is no transistor that operates with a very small operation current. Thus, a decrease in linearity can be suppressed.

In the variable gain amplifier of the present invention, the attenuators are provided only between the plurality of cascode amplifiers. Each attenuator is for attenuating the signal to be input to the subsequent amplifying transistor, more than the signal in the preceding amplifying transistor. Therefore, it need not particularly be provided between a signal input terminal and the first-stage amplifying transistor, or after the last-stage amplifying transistor. For example, if an attenuator is provided before the first-stage amplifying transistor, the gain is attenuated from the start so that a noise characteristic is deteriorated by a degree corresponding to the attenuation of the gain. For this reason, in the present invention, attenuators are provided at the minimum required positions, that is, between the plurality of cascode amplifiers.

In the variable gain amplifier of the present invention, the plurality of cascode transistors of each cascode amplifier comprises signal transmitting transistors connected to an output load, and signal shunting transistors connected to a voltage supply terminal, and the first controller controls the ON/OFF operations of the plurality of cascode transistors such that the total of W/L, where W is a gate width of each cascode transistor and L is a gate length of the cascode transistor, of signal transmitting and shunting transistors to be turned on, is always constant.

According to the above feature of the invention, because W/L of cascode transistors to be turned on is constant, the quantity of a change in gain can be accurately set by changing W/L of the signal transmitting transistors to be turned on, to change the distribution ratio of the current to flow in a signal transmission path. In addition, because the gain is changed by ON/OFF control of cascode transistors, there is no transition state in which a very small current flows in a cascode transistor when changing the gain. This can suppress a decrease in linearity to be generated due to reduction of the power consumption.

In the variable gain amplifier of the present invention, the plurality of cascode transistors of each cascode amplifier comprises a first transistor as a signal transmitting transistor; and a differential pair constituted by a second transistor as a signal shunting transistor, and a third transistor as a signal transmitting transistor equal in W/L to the second transistor, and the first controller performs control such that the first transistor is always turned on, and one of the second and third transistors constituting the differential pair is turned on and the other is turned off.

According to the above feature of the invention, the gain can be changed by switching over ON/OFF of the second and third transistors constituting one differential pair so as to switch over the signal flowing in the differential pair between the second transistor as a signal shunting path and the third transistor as a signal transmission path. Because the second and third transistors are equal in size, the two transistors constituting the differential pair can be laid out in a compact form. In addition, because the second and third transistors are equal in characteristics, the current flowing in the first transistor that is always on does not change in quantity when ON/OFF of the two transistors are switched over to change the gain. Thus, the linearity is not deteriorated.

In the variable gain amplifier of the present invention, the plurality of cascode transistors of each cascode amplifier comprises a plurality of differential pairs, and W/L of the cascode transistors constituting each of the plurality of differential pairs is powers of two in comparison with a reference value of W/L.

According to the present invention, because the size W/L of the cascode transistors constituting each of the plurality of differential pairs is powers of two in comparison with the reference value of W/L, the total of W/L of the signal transmitting transistors to be turned on, that is, the quantity of a signal current, i.e., gain, flowing in a signal transmission path, can be changed stepwise with corresponding to a plurality of bits, i.e., a digital binary signal, by controlling ON/OFF of two transistors constituting each differential pair, that is, the second and third transistors.

In the variable gain amplifier of the present invention, each of the plurality of cascode transistors of each cascode amplifier comprises a plurality of unit transistors equal in W and L and connected in parallel. According to this feature, a more uniform, compact layout is possible. In addition, fluctuation of threshold of the plurality of cascode transistors is improved, and signal, i.e., current, distribution at a desired distribution ratio can be accurately performed.

In the variable gain amplifier of the present invention, the first controller applies a gate potential, which is to determine an ON/OFF operation, in common to gate terminals of corresponding cascode transistors in the plurality of cascode amplifiers. As described above, of the plurality of cascode amplifiers, the amplifying transistor of only selected one cascode amplifier is supplied with a constant current so that only the cascode amplifier performs signal amplification. Therefore, according to the present invention, the gate potential can be applied in common to the corresponding cascode transistors in the plurality of amplifiers. This makes it possible to reduce the number of elements and the power consumption of the first controller.

In the variable gain amplifier of the present invention, the first controller applies, to a gate terminal of the first transistor, a constant potential lower than a power supply potential, as an ON signal, and the first controller applies the constant potential as an ON signal to one of the second and third transistors, and applies a ground potential as an OFF signal to the other of the second and third transistors. According to this feature, by applying the constant potential lower than the power supply potential, as the ON signal, to the gate terminal of the cascode transistor, the difference in potential between the drain and the source of the cascode transistor to be turned on can be increased and thereby the linearity can be improved.

In the variable gain amplifier of the present invention, the first controller comprises a resistor connected in series between a power source and a ground to generate the constant potential, and a switch that shunts the constant potential to the ground. According to this feature, the gate potential of each cascode transistor can be controlled with a simple circuit construction. Thus, reduction of the number of elements and reduction of the power consumption can be expected.

In the variable gain amplifier of the present invention, the quantity of attenuation of each of the attenuators is set such that a maximum gain obtained by a subsequent cascode amplifier is lower than a minimum gain obtained by a preceding cascode amplifier. According to this feature, the gain never rises when a cascode amplifier is switched over to a subsequent amplifier. This can realize a gain characteristic that decreases monotonically.

In the variable gain amplifier of the present invention, a AC-shunt capacitor is added to a gate terminal of each cascode transistor. According to this feature, even if a high-frequency signal is generated due to a parasitic capacitance between the gate and the source of a cascode transistor, the high-frequency signal can be allowed to dump to the ground. Further, the RC time constant can be increased by adding a resistor to the gate terminal so that sharp rising/falling of the gate potential can be prevented in ON/OFF switching of the cascode transistor.

In the variable gain amplifier of the present invention, the variable gain amplifier further comprises a base current supplying section that supplies a base current of a base terminal of each amplifying transistor that is made into a bipolar transistor, on the basis of an instruction from the second controller, and the base current supplying section comprises a constant current source and a switch that shunts the constant current source to a ground. According to this feature, the constant base current is supplied to the base terminal of the amplifying transistor when the switch is off. When the switch is on, the constant current source is shunted to the ground so that no base current is supplied to the base terminal of the amplifying transistor. Thus, the constant current can be allowed to flow only in selected amplifying transistor.

In the variable gain amplifier of the present invention, the output load is connected to a first voltage supply terminal, and a drain terminal of each signal shunting transistor is connected to a second voltage supply terminal, and the first and second voltage supply terminals are connected to respective power sources independent of each other. According to this feature, part of a signal allowed to dump from the signal shunting transistor to the power supply never leaks to the signal output terminal side. Particularly in the case that the gain is set to a small value, the signal current can be reduced to a small value.

In a communication apparatus including therein a variable gain amplifier as described above, the gain can be controlled in a wide range. Further, because deterioration of the linearity of the variable gain amplifier can be suppressed when controlling the gain, this improve the linearity of the whole of the communication apparatus.

BRIEF DESCRIPTION OF THE DRAWINGS

Other and further objects, features and advantages of the invention will appear more fully from the following description taken in connection with the accompanying drawings in which.

DESCRIPTION OF THE PREFERRED EMBODIMENTS

An embodiment of the present invention will be described. The embodiment is an example in which the present invention is applied to a low noise amplifier provided in a communication apparatus such as a stationary television receiver or a cellular phone.

Figure 1:
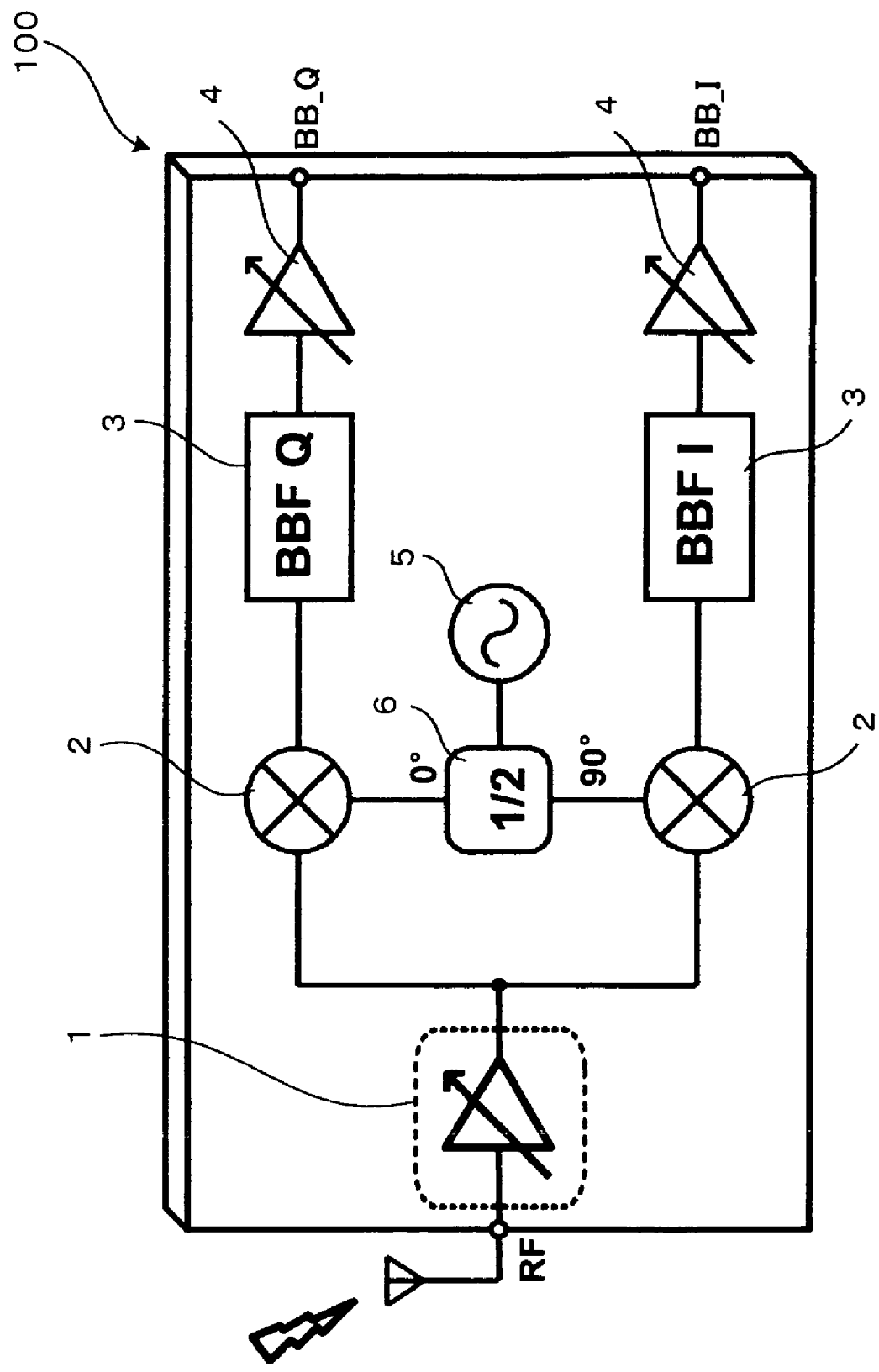
FIG. 1 is a block diagram showing a construction of a communication apparatus according to an embodiment of the present invention.

FIG. 1 shows a general construction of a receiving circuit of a communication apparatus 100 according to the embodiment. The communication apparatus 100 of the embodiment includes therein a low noise amplifier (LNA) 1; mixers 2, each of which serves as a frequency converter; base band filters (BBFs) 4; BB variable gain amplifiers (BBVGAs) 4; and so on. The circuit from the LNA 1 through the mixers 2 and the BBFs 3 to the BBVGAs 4 is formed into an LSI on a single chip.

An RF signal of, for example, 474-864 MHz, received through an antenna, is amplified by the LNA 1, and then input to two mixers 2. The mixers 2 are input with local (LO) signals different in phase by 90 degrees, from a voltage controlled oscillator (VCO) 5 as a local oscillator, through a frequency divider 6. Signals BB_Q and BB_I obtained by multiplying the RF signals by the respective LO signals, are restricted by the BBFs 3 to a predetermined band, for example, about DC-3.8 MHz, to be converted into intermediate frequency (IF) signals. The IF signals are then amplified by the respective BBVGAs 4. The IF signals amplified by the BBVGAs 4 are demodulated by a demodulator on a not-shown subsequent stage, and data with respect to characters, images, sounds, etc., is taken out by the demodulator.

Figure 2:
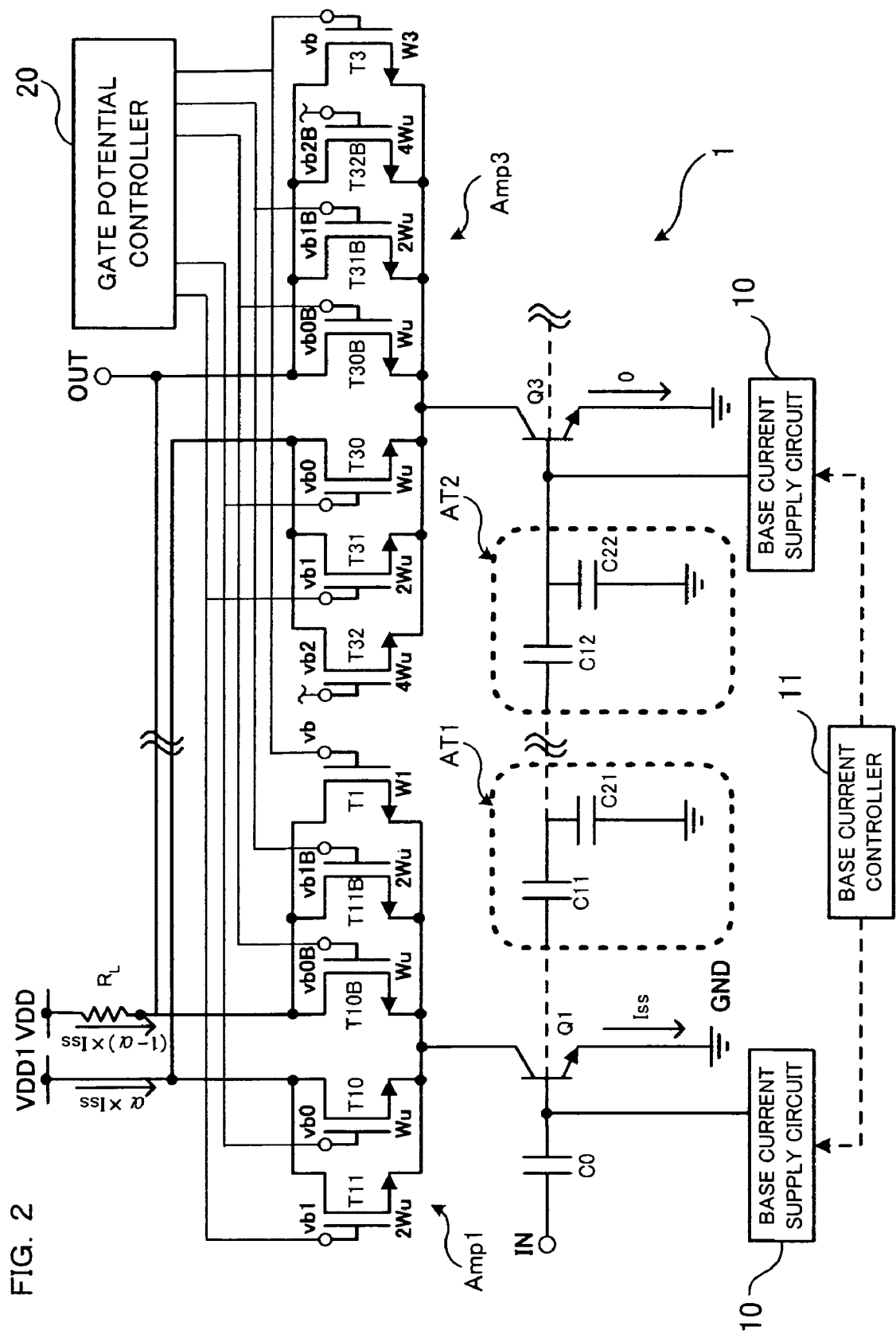
FIG. 2 is a circuit diagram of an LNA as a variable gain amplifier according to the embodiment.

Next, the LNA 1 to which the present invention is applied will be described. FIG. 2 is a circuit diagram showing a construction of the LNA 1. As shown in FIG. 2, the LNA 1 includes therein five cascode amplifiers Amp connected in parallel between a signal input terminal IN and a signal output terminal OUT, with an attenuator AT being interposed between the amplifiers Amp. FIG. 2 shows only the first-stage cascode amplifier Amp1 and the third-stage cascode amplifier Amp3. The second-, fourth-, and fifth-stage cascode amplifiers Amp2, Amp4, and Amp5 are omitted in FIG. 2. Further, FIG. 2 shows only an attenuator AT1 provided between the first- and second-stage cascode amplifiers Amp1 and Amp2, and an attenuator AT2 provided between the second- and third-stage cascode amplifiers Amp2 and Amp3. Attenuators AT3 and AT4 on the subsequent stages, as shown in FIG. 3, are omitted in FIG. 2.

Each cascode amplifier Amp includes therein an amplifying transistor Q, for example, one of Q1 to Q5, connected to the signal input terminal IN; and a plurality of cascode transistors T, for example, T1, T10, etc., connected to an output terminal of the amplifying transistor Q. The LNA 1 further includes therein base current supply circuits 10 that supply base currents to respective five amplifying transistors Q; a base current controller 11, as a second controller, that controls the base current supply circuits 10; and a gate potential controller 20, as a first controller, that controls gate potentials of the plurality of cascode transistors T.

The respective amplifying transistors are made of common-emitter bipolar transistors equal in characteristics. A base terminal of each amplifying transistor is connected to the signal input terminal IN so that the RF signal received through the antenna is input to the amplifying transistor via the signal input terminal IN. A capacitor C0 is provided between the signal input terminal IN and the first-stage amplifying transistor Q1 in order to remove the direct current component of the RF signal. The base terminal of each amplifying transistor Q is connected also to the corresponding base current supply circuit 10 that supplies a base current to the base terminal.

Figure 3:
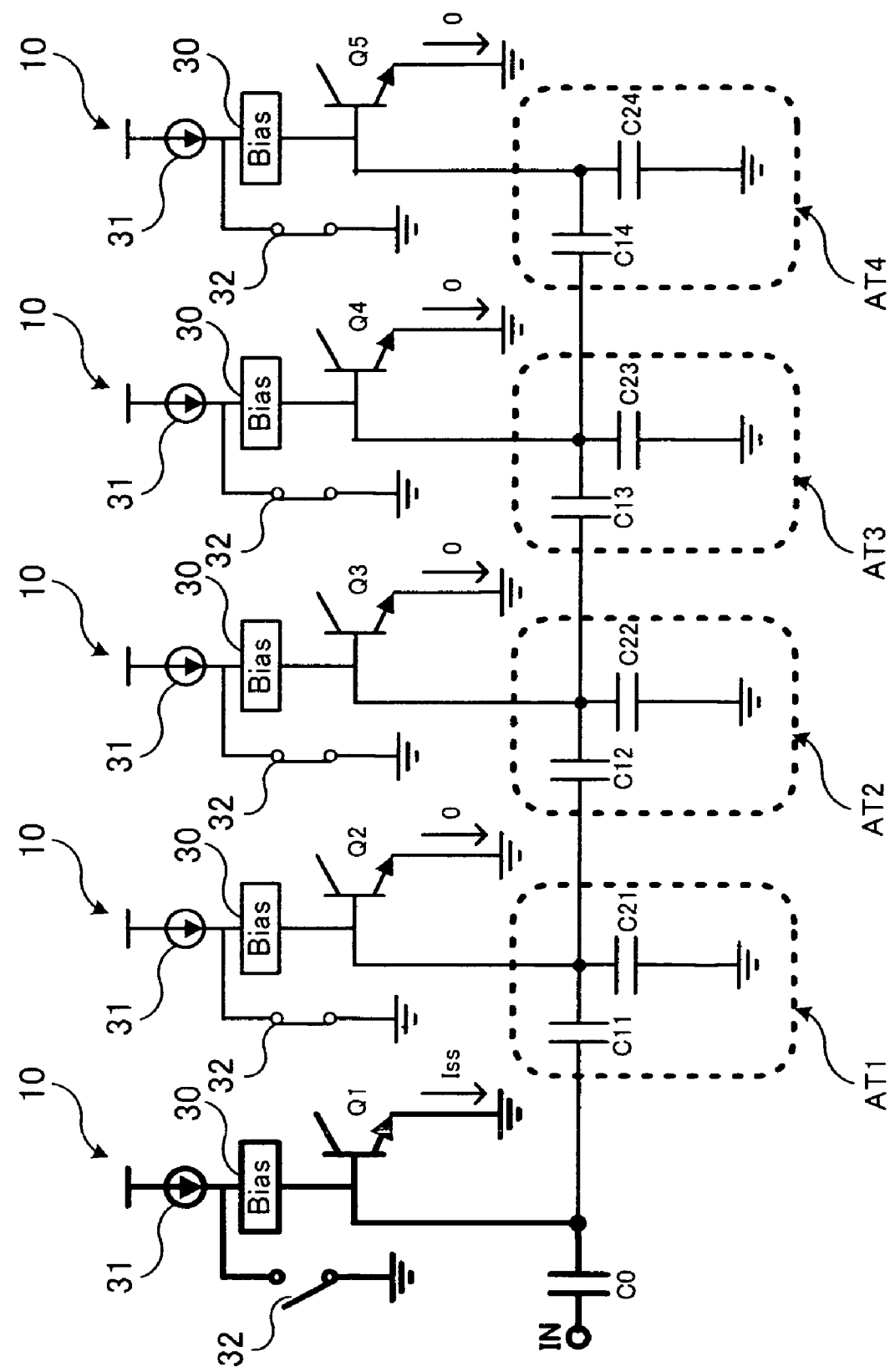
FIG. 3 is a circuit diagram showing five amplifying transistors and base current supply circuits.

As shown in FIG. 3, each base current supply circuit 10 includes therein a bias circuit 30; a constant current source 31 that supplies a constant current to the bias circuit 30; and a switch 32 that connects the constant current source 31 to the ground. By switching ON/OFF of the switch 32 on the basis of a signal from the base current controller 11, each base current supply circuit 10 supplies a constant base current to the base terminal to the corresponding amplifying transistor Q, or sets the base current to zero.

Even in the case of a base current supply circuit 10 in which the switch 32 is provided between the bias circuit 30 and the base terminal of the corresponding amplifying transistor Q, the current to be supplied to the base terminal can be turned ON/OFF. In this construction, however, unnecessary noise generated in the ON/OFF operation of the switch 32 is mixed in the RF signal because the switch 32 exists in the input path for the RF signal. For this reason, in this embodiment, the switch 32 is provided at the node between the constant current source 31 and the bias circuit 30, and thereby noise generated in the ON/OFF operation of the switch 32 is prevented from being mixed in the input signal.

The base current controller 11 outputs a signal to one of five base current supply circuits 10 so as to supply a constant base current of the base terminal of the amplifying transistor Q of the circuit. Thus, the base terminal of only one of five amplifying transistors Q is supplied with a constant base current so that a constant current Iss flows between the collector and the emitter of the amplifying transistor Q, that is, the transistor Q is turned on, while the base terminals of the other amplifying transistors Q are supplied with no base currents and thus no current flows between the collector and the emitter of any of the other transistors Q, that is, the transistor Q is kept off. In short, the base current controller 11 controls ON/OFF operations of five amplifying transistors Q such that a constant current Iss flows in only one selected out of the amplifying transistors Q, that is, only the selected transistor Q is turned on. FIG. 3 shows a state in which the base terminal of the first-stage amplifying transistor Q1 is supplied with a constant base current so that a constant current Iss flows in the amplifying transistor Q1.

Four attenuators AT1 to AT4 are provided at the respective nodes between five amplifying transistors Q. Each attenuator ATn (n=1 to 4) includes therein a capacitor $C_{1n}$ connected in series with the capacitor C0 of the signal input path; and a capacitor $C_{2n}$ connected in a shunt form between the signal path that connects the capacitor $C_{1n}$ and the base terminal of the corresponding amplifying transistor Q, and the ground.

Each attenuator AT is for further attenuating the signal to be input to the cascode amplifier Amp on the subsequent stage, more than the signal in the cascode amplifier Amp on the preceding stage. Therefore, it need not particularly be provided between the signal input terminal IN and the first-stage amplifying transistor Q1, or after the last-stage, i.e., the fifth-stage, amplifying transistor Q5. If an attenuator AT is provided before the first-stage amplifying transistor Q1, the gain is attenuated from the start so that the noise characteristic is deteriorated by a degree corresponding to the attenuation of the gain. For this reason, in this embodiment, attenuators AT are provided at the minimum required positions, that is, at the respective nodes between five cascode amplifiers Amp.

When the quantity of change in gain, i.e., the quantity of attenuation, of each attenuator AT is represented by $G_{attn}$ (n=1 to 4) (dB), $G_{attn}$ is theoretically determined by the following Expression 2.

$$G_{attn} = -\frac{C_{1n}}{C_{1n} + C_{2n}}$$ [Expression 2]

However, the actual value deviates from the theoretical value obtained by the Expression 2, due to the influence of the parasitic capacitance of a transistor and so on. Therefore, by carrying out a simulation, the capacitances of the capacitors $C_{1n}$ and $C_{2n}$ that constitute each attenuator AT, are properly determined so that a desired quantity of attenuation can be obtained.

As will be described later, in each cascode amplifier Amp, the distribution ratio of the signal current Iss can be changed by ON/OFF operations of a plurality of cascode transistors connected to the output terminal of the amplifying transistor Q, to vary the gain. Thereby, the quantity $G_{att}$ of change in gain, i.e., the quantity of attenuation, of each attenuator AT is set such that the maximum gain obtained by the cascode amplifier Amp of the subsequent stage is lower than the minimum gain obtained by the cascode amplifier Amp on the preceding stage. Thus, the gain never rises when the cascode amplifier Amp is switched over to the amplifier on the subsequent stage. This can realize a gain characteristic that decreases monotonically.

In the LNA 1 of this embodiment, each quantity $G_{att}$ (dB) of change in gain of four-stages attenuators AT is specifically set as $(G_{att1}, G_{att2}, G_{att3}, G_{att4})=(-4, -4, -12, -12)$. That is, the second-, third-, fourth-, and fifth-stage amplifying transistors Q2 to Q5 are input with RF signals that have been attenuated by 4 dB, 8 dB=4 dB+4 dB, 20 dB=4 dB+4 dB+12 dB, and 32 dB=4 dB+4 dB+12 dB+12 dB, respectively.

Each cascode transistor T is a MOS field effect transistor (MOSFET) connected to the corresponding amplifying transistor Q in a cascode arrangement. As shown in FIG. 2, the source terminals of a plurality of cascode transistors T are connected to the collector terminal of the corresponding amplifying transistor Q. The drain terminals of some of the plurality of cascode transistors T, for example, transistors T1, T10B, and T11B of the first-stage cascode amplifier Amp1, are connected to a resistor $R_L$ as an output load connected to a power supply VDD of, for example, 2.9 V. These cascode transistors T serve as signal transmitting transistors that transmit the signal amplified by the amplifying transistor Q, to the signal output terminal OUT. On the other hand, the drain terminals of the remaining cascode transistors T, for example, transistors T10 and T11 of the first-stage cascode amplifier Amp1, are connected to VDD1 of, for example, 2.9 V. These cascode transistors T serve as signal shunting transistors that shunt the signal amplified by the amplifying transistor Q, to the VDD1 as a voltage supply terminal.

The gate potential controller 20 selectively applies one of a constant potential $V_0$ of, for example, 2.4 V, as an ON signal, and the ground potential of 0 V as an OFF signal, to the gate terminal of each of the plurality of cascode transistors T to control the ON/OFF operation of the transistor.

Figure 4:
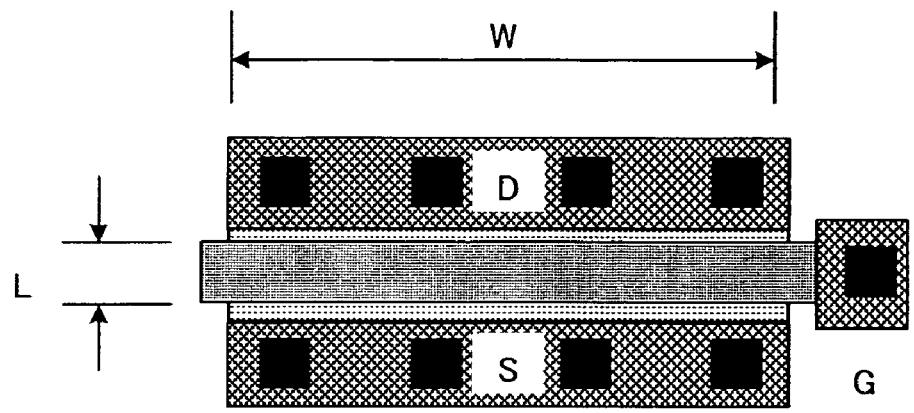
FIG. 4 is a schematic view of a cascode transistor.

For any of five cascode amplifiers Amp, the gate potential controller 20 controls the ON/OFF operations of the plurality of cascode transistors T such that the total of sizes of cascode transistors T, which mean the ratio W/L of the gate width W to the gate length L in this embodiment, to be turned on, i.e., in which a current is allowed to flow, is always constant. In this embodiment, the gate width W and the gate length L of a field effect transistor (FET) having a drain (D), a gate (G), and a source (S), are as shown in FIG. 4. Fundamentally, when the same gate potential is applied to FETs equal in W/L, the same amount of current flows between the drain and the source of any FET. That is, the current that flows in such an FET is in proportion to the size W/L of the FET.

More specifically, in this embodiment, the gate length L of any cascode transistor T has a fixed value. In any cascode amplifier Amp, the gate potential controller 20 controls ON/OFF operations of a plurality of transistors T such that the total of the gate widths W of cascode transistors T to be turned on is always a constant value $W_{total}$, for example, $W_{total}=50$ micrometers.

By the gate potential controller 20 controlling ON/OFF operations of signal shunting transistors connected to the VDD1 and signal transmitting transistors connected to the resistor $R_L$, of the plurality of cascode transistors T, the constant current Iss flowing in the amplifying transistor Q is distributed at a desired distribution ratio alpha to two paths of a path via the signal shunting transistors, that is, a signal shunt path, and a path via the signal transmitting transistors, that is, a signal transmission path. That is, the gain can be controlled by allowing part of the signal to dump to the VDD1 so as to change the quantity of current flowing in the signal transmission path connected to the signal output terminal OUT. In the gain control of each cascode amplifier Amp, there is no deterioration due to distortion caused by any amplifying transistor Q because the constant current Iss is supplied to only one amplifying transistor Q. In addition, because the current density is constant as far as the total size of cascode transistors T is equal, the deterioration of the linearity of the LNA 1 is suppressed.

If the resistor RL connected to the drain terminals of the signal transmitting transistors of the plurality of cascode transistors T, and the drain terminals of the signal shunting transistors, are connected to a common power supply VDD as a voltage supply terminal, part of the signal to dump from the signal shunting transistors to the VDD may leak to the signal output terminal OUT. In particular, in the case that the gain must be set to a small value, the current flowing in the signal transmission path, i.e., the signal transmitting transistors, can not be reduced to a desired quantity. For this reason, in this embodiment, the VDD, as a first voltage supply terminal, to which the resistor $R_L$ is connected, and the VDD1, as a second voltage supply terminal, to which the drain terminals of the signal shunting transistors are connected, are led out of the chip and connected to two independent power sources.

Figure 5:
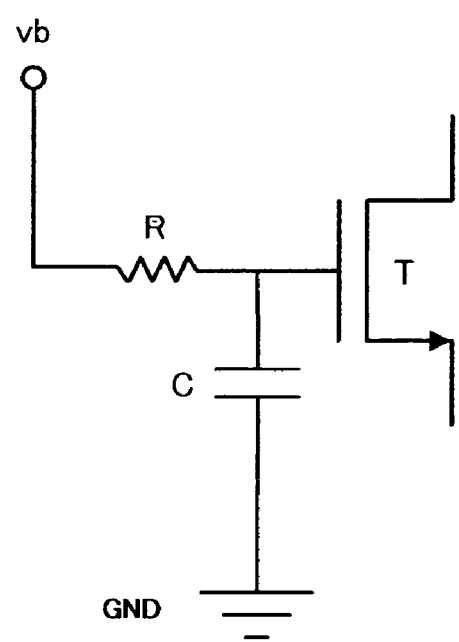
FIG. 5 is a circuit diagram of an RC circuit connected to a gate terminal of the cascode transistor.

As shown in FIG. 5, a capacitor C as a AC-shunt capacitor that shunts the gate voltage supply path to the ground is preferably added to the gate terminal vb of each cascode transistor T. In this case, even if a high frequency signal is generated due to a parasitic capacitance between the gate and the source of the cascode transistor T, the high frequency component can be allowed to dump to the ground so that only the low frequency component is allowed to pass. Further, a resistor R is also preferably provided in the gate voltage supply path. In the case that the RC circuit is thus provided at the gate terminal, the RC time constant is increased and sharp rising/falling, i.e., ringing, of the gate potential can be prevented in ON/OFF switching of the cascode transistor.

The above-described signal (current) distribution operation of the plurality of cascode transistors T will be described more specifically by focusing the third-stage cascode amplifier Amp3 in particular. As shown in FIG. 2, the third-stage cascode amplifier Amp3 includes therein seven cascode transistors T, i.e., T3, T30, T30B, T31, T31B, T32, and T32B, connected in parallel. Of the transistors, the transistor T3, as a first transistor, is a signal transmitting transistor connected to the resistor $R_L$. The transistors T30, T31, and T32, as second transistors, are signal shunting transistors connected to the power supply VDD1. The transistors T30B, T31B, and T32B, as third transistors, are signal transmitting transistors like the transistor T3.

The signal shunting transistor T30 and the signal transmitting transistor T30B are equal to each other in size of the gate width W and the gate length L, that is, the ratio W/L, which transistors constitute a differential pair. Likewise, the signal shunting transistor T31 and the signal transmitting transistor T31B are equal to each other in W/L, which transistors constitute a differential pair. Further, the signal shunting transistor T32 and the signal transmitting transistor T32B are equal to each other in W/L, which transistors constitute a differential pair.

The gate potential controller 20 always applies a constant potential $V_0$ to the gate terminal of the transistor T3, which serves as a core, to turn the transistor on. For the transistors T30 and T30B constituting a differential pair, the constant potential $V_0$ as an ON signal is applied to the gate terminal of one transistor while the ground potential as an OFF signal is applied to the gate terminal of the other transistor. The same applies to the respective differential pairs of the transistors T31 and T31B; and T32 and T32B, and the constant potential $V_0$ is applied to the gate terminal of one transistor of each differential pair while the ground potential is applied to the gate terminal of the other transistor. That is, one of two transistors constituting a differential pair is turned on and allows a current to flow therein, and at this time, however, the other transistor is kept off and allows no current to flow therein.

The core transistor T3 that is always turned on is for ensuring a certain amount of current in the signal transmission path to set the minimum gain to the third-stage cascode amplifier Amp3 when all of the signal shunting transistors T30, T31, and T32, each constituting a differential pair, are turned on, that is, all of the signal transmitting transistors T30B, T31B, and T32B are off.

The ratios W/L of the transistors T30 and T30B; and so on, each constituting a differential pair, are powers of two in comparison with a reference value of W/L. More specifically, the gate length L of any cascode transistor T constituting a differential pair is a fixed value. The gate width W of the transistors T30 and T30B is one time, i.e., $2^0$ times, of a predetermined unit width Wu of, for example, 5 micrometers; the gate width W of the transistors T31 and T31B is two times, i.e., $2^1$ times, of the unit width Wu; and the gate width W of the transistors T32 and T32B is four times, i.e., $2^2$ times, of the unit width Wu. As described above, the total of the gate widths W of cascode transistors T to be turned on, that is, to allow a current to flow therein, is the same value $W_{total}$ in any cascode amplifier Amp, and one of the transistors in each differential pair is always turned on. Therefore, the gate width W3 of the core transistor T3 that is always turned on has a value obtained by subtracting the gate widths of three differential pairs, i.e., Wu, 2Wu, and 4Wu, from the $W_{total}$, that is, $W3=W_{total}-7Wu$.

Because the gate widths W of the respective cascode transistors T are thus set, the quantity of distribution of signal, i.e., current, can be changed stepwise by controlling ON/OFF operations of transistors each constituting a differential pair. In the below description, the gate potential of the transistor T1 is represented by vb; the gate potentials of the transistors T32, T31, and T30 are represented by vb2, vb1, and vb0, respectively; and the gate potentials of the transistors T32B, T31B, and T30B are represented by vb2B, vb1B, and vb0B, respectively.

Using a 3-bit digital signal (b2, b1, b0), the gate potentials vb2, vb1, and vb0 of the transistors T32, T31, and T30, which are signal shunting transistors, can be expressed as (vb2, vb1, vb0)=$V_0$×(b2, b1, b0). That is, the constant potential $V_0$ is applied to a transistor the corresponding bit value to which is one, while the ground potential is applied to a transistor the corresponding bit value to which is zero.

Figure 6:
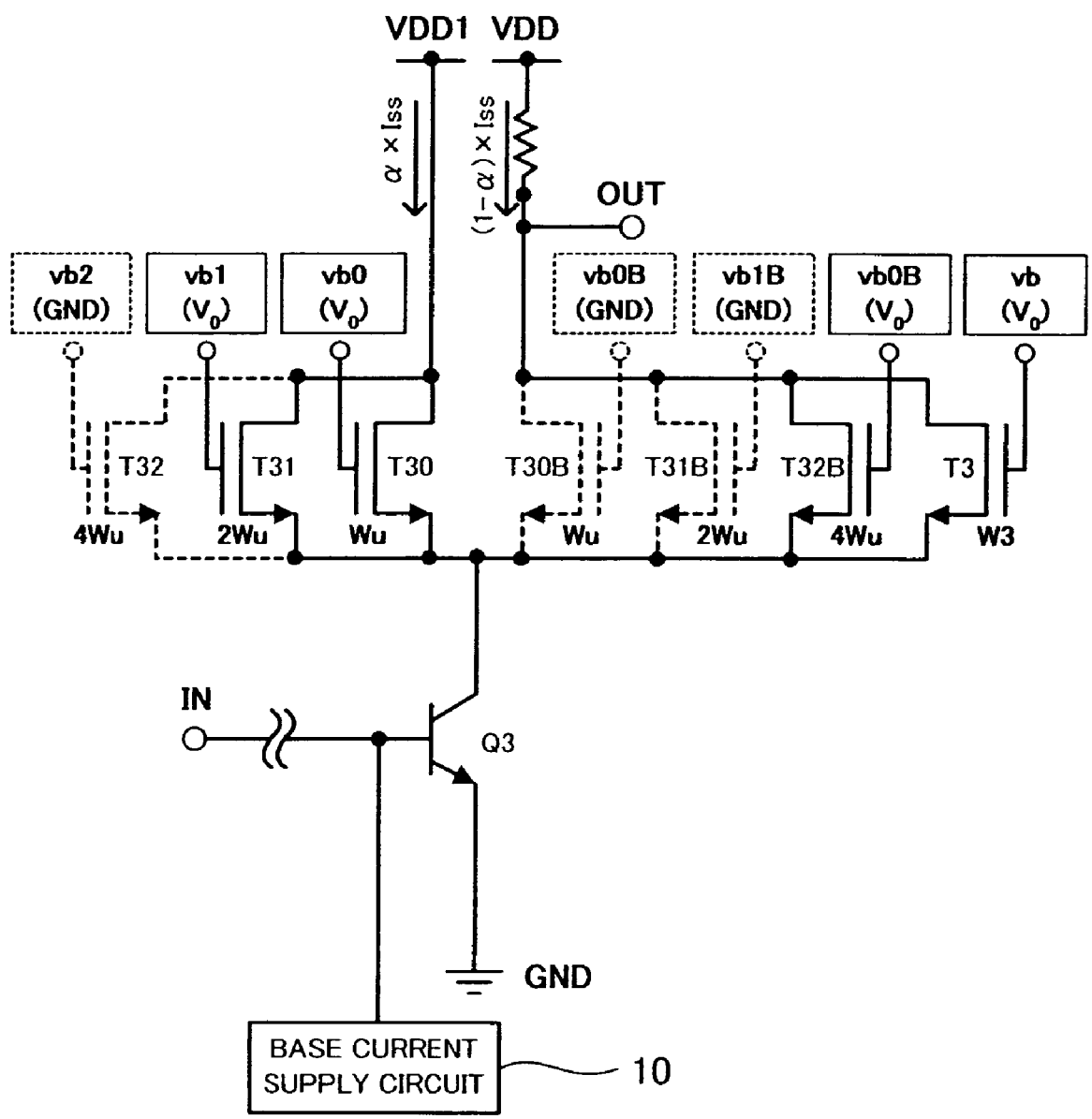
FIG. 6 is a diagram for explaining an example of ON/OFF operation of a cascode transistor in the third-stage cascode amplifier.

For example, (b2, b1, b0)=(0, 1, 1) indicates a state in which, as shown in FIG. 6, the transistor T32 is off, that is, the other transistor T32B in the pair is turned on; the transistor T31 is turned on, that is, the other transistor T31B in the pair is off; the transistor T30 is turned on, that is, the other transistor T30B in the pair is off; part of the signal is transmitted to the VDD via the transistors T3 and T32B; and the remaining part of the signal is allowed to dump to the VDD1 via the transistors T31 and T32.

When the total of the gate widths W of the signal shunting transistors to be turned on is represented by $W_{alpha}$, $W_{alpha}$ (b2, b1, b0)=Wu(b2×$2^2$+b1×$2^1$+b0×$2^0$) That is, when the bit b0 becomes one, the current flowing in the differential pair of the gate width Wu is switched from VDD to VDD1. When the bit b1 becomes one, the current flowing in the differential pair of the gate width 2Wu is switched from VDD to VDD1. When the bit b2 becomes one, the current flowing in the differential pair of the gate width 4Wu is switched from VDD to VDD1. That is, according to the 3-bit digital signal (b2, b1, b0), the signal current to dump to the VDD1 can be changed by a certain quantity, that is, the quantity of current corresponding to the unit gate width Wu.

In the above, the cascode transistors T of the third-stage cascode amplifier Amp3 were described. Substantially the same applies to the cascode transistors T of the cascode amplifier Amp on any other stage. In particular, the cascode transistors of the fourth- and fifth-stage cascode amplifiers Amp 4 and Amp 5 are the same in constitution as the cascode transistors of the third-stage cascode amplifier 3. That is, the cascode transistors include a core transistor that is always turned on; a differential pair constituted by two transistors each having its gate width of Wu; a differential pair constituted by two transistors each having its gate width of 2Wu; and a differential pair constituted by two transistors each having its gate width of 4Wu.

On the other hand, in the first- and second-stage cascode amplifiers Amp1 and Amp2, there is provided no differential pair constituted by two transistors each having its gate width of 4 Wu. That is, as shown in FIG. 2, the first-stage cascode amplifier Amp1 only includes therein a core transistor T1 that is always turned on; a differential pair constituted by two transistors T10 and T10B each having its gate width of Wu; and a differential pair constituted by two transistors T11 and T11B each having its gate width of 2 Wu. Because the total of the ratios W/L of the cascode transistors T that are turned on is fixed in any of five cascode amplifiers Amp, the gate width W1 of the transistor T1 is W1=$W_{total}$−Wu−2Wu=$W_{total}$−3Wu.

That is, in the first- and second-stage cascode amplifiers Amp1 and Amp2, the range of variation of gain by ON/OFF switching of cascode transistors T is narrow in comparison with the third- or later-stage cascode amplifier Amp. ON/OFF switching of two differential pairs in the first- and second-stage cascode amplifiers Amp1 and Amp2 can be expressed by two bits of (b1, b0), that is, the bit b2 is always zero. When switching the cascode amplifier Amp, the interposition of an attenuator AT can be expected to improve the linearity by the degree corresponding to the deterioration of gain. For this reason, the range of switching of gain by the first- and second-stage cascode amplifiers Amp1 and Amp2, for which the characteristic of linearity is important, is made narrower than that by the third- or later-stage cascode amplifier.

As described above, in each amplifier Amp, the distribution ratio alpha, =$W_{alpha}$/$W_{total}$, to the VDD1, of the signal current Iss amplified by the amplifying transistor Q, is determined according to a 3-bit digital signal (b2, b1, b0). In accordance with the distribution ratio alpha, the signal current is distributed to two paths of the signal shunt path connected to the VDD1 and the signal transmission path connected to the VDD. The quantity $G_{loss}$ of reduction of gain when a current of alpha×Iss is allowed to dump to the VDD1 is given by the following Expression 3.

$$G_{loss} = 20\log\left(\frac{W_{total} - W_\alpha}{W_{total}}\right) \quad \text{[Expression 3]}$$

As described above, $W_{total}$ is the total of the gate widths W of the cascode transistors T that are turned on, and the value of $W_{total}$ is always fixed. On the other hand, $W_{alpha}$ is the total of the gate widths W of the signal shunting transistors that are turned on, and $W_{alpha}$(b2, b1, b0)=Wu(b2×$2^2$+b1×$2^1$+b0×$2^0$) when expressed using a 3-bit digital signal (b2, b1, b0). When (b2, b1, b0)=(0, 0, 0), the whole of the current supplied to the amplifying transistor Q flows in the signal transmission path connected to the signal output terminal OUT, and at this time the gain becomes the maximum, i.e., $G_{max}$. The maximum gain $G_{max}$ is given by the following Expression 4.

$$G_{max} = 20 \log(gm \cdot R_L) \quad \text{[Expression 4]}$$

In the Expression 4, gm represents transconductance of a common-emitter transistor, and gm=Iss/$V_T$. The $V_T$ represents thermal voltage, which is a constant common in transistors and about 26 mV.

According to the above description, when the cascode amplifier Amp on the m-th stage is selected and a 3-bit digital signal (b2, b1, b0) is input to the gate potential controller 20, the gain Gm of the LNA 1 can be obtained by a simple model expression as shown by the following Expression 5.

$$G_m(b2, b1, b0) = G_{max} + 20\log\left(\frac{W_{total} - W_\alpha(b2, b1, b0)}{W_{total}}\right) + \sum_{n=1}^{m-1} G_{attn} \quad \text{[Expression 5]}$$

Figure 7A:
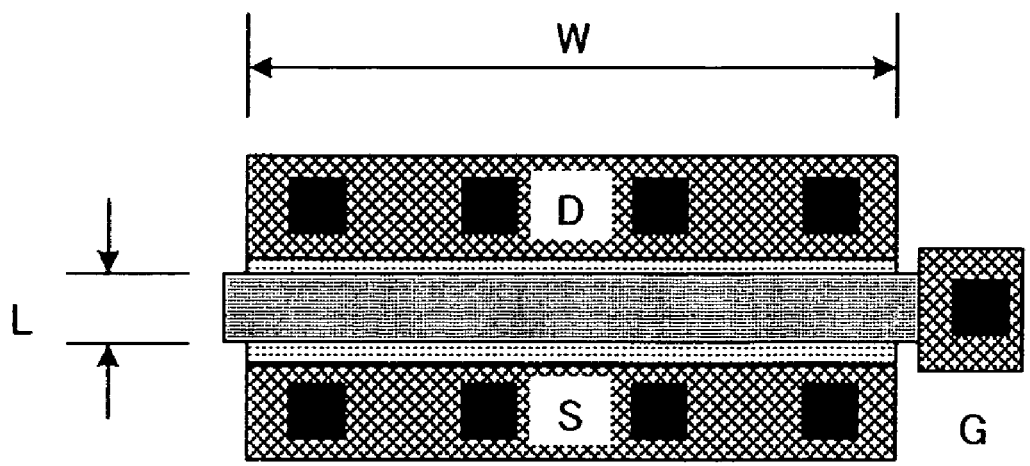
FIG. 7A is a schematic view of a cascode transistor in the case that the number of transistors connected in parallel is one.
Figure 7B:
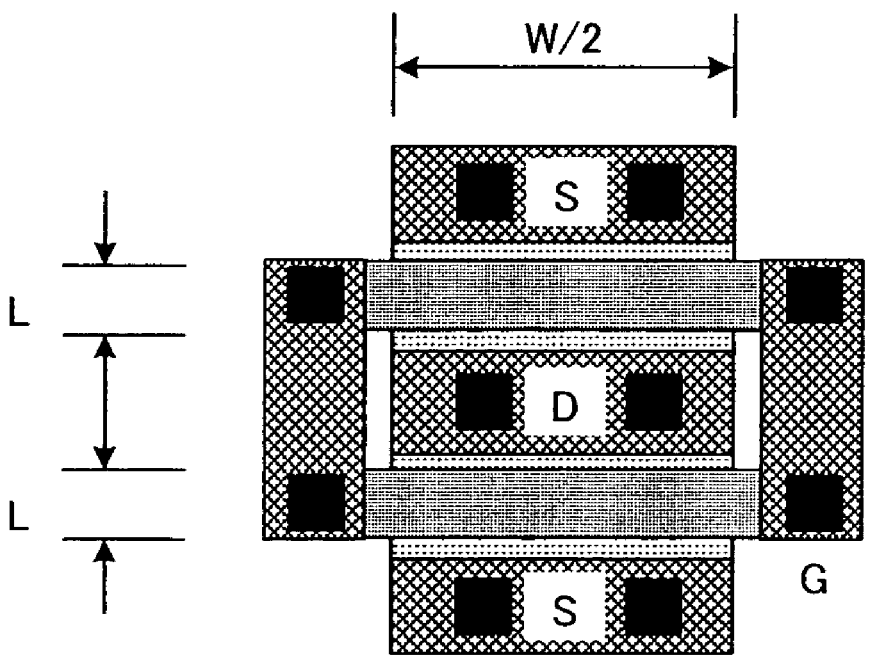
FIG. 7B is a schematic view of a cascode transistor in the case that the number of transistors connected in parallel is two.

In the case that a transistor having its gate length of L and its gate width of W is actually laid out on a chip, only one transistor having its gate length of L and its gate width of W may be used as shown in FIG. 7A, in this case, the finger number is one. Or, as shown in FIG. 7B, two transistors each having the same gate length of L and a gate width of W/2 may be used by being connected in parallel to form an equivalent circuit to the transistor of FIG. 7A, the finger number of which is one. The finger number in the case of FIG. 7B is two. By connecting small-size transistors in parallel, as shown in FIG. 7B, a more uniform compact layout is possible.

Figure 8:
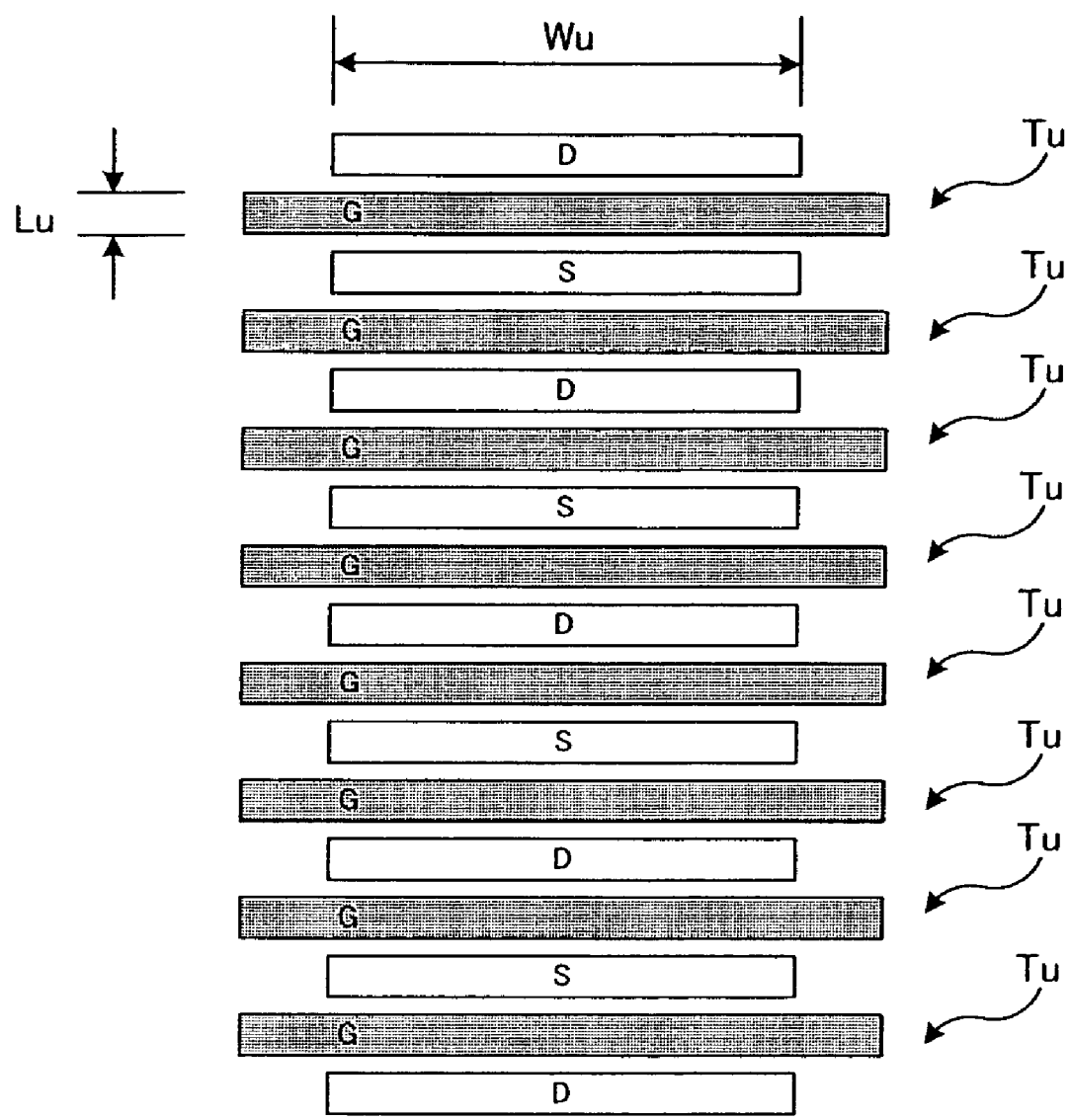
FIG. 8 is a schematic view of a cascode transistor made up of a plurality of unit transistors connected in parallel.

For this reason, in this embodiment, using a transistor having its gate width of Wu, such as T30 or T30B, as a unit transistor Tu, each transistor having its gate width of 2Wu, such as T31 or T31B, is actually made up of two unit transistors Tu connected in parallel, that is, the finger number is two; and each transistor having its gate width of 4Wu, such as T32 or T32B, is actually made up of four unit transistors Tu connected in parallel, that is, the finger number is four. In addition, each core transistor that is always turned on, such as T3, is also made up of a plurality of unit transistors Tu. As shown in FIG. 8, each of a plurality of cascode transistors T of each cascode amplifier Amp is made up of n unit transistors Tu connected in parallel, that is, the finger number is n. According to this configuration, a uniform, compact layout is possible. In addition, because the threshold fluctuation of a plurality of cascode transistors T is improved, the distribution of signal, i.e., current, at a desired distribution ratio can be realized more accurately.

Next, the gate potential controller 20 will be described. As shown in FIG. 2, on the basis of a 3-bit digital signal (b2, b1, b0) input from a not-shown A/D converter, the gate potential controller 20 applies a constant potential $V_0$ or the ground potential, which determines an ON/OFF operation, to each of a plurality of cascode transistors T included in each of five cascode amplifiers Amp.

In this embodiment, the gate potential controller 20 applies the same gate potential to cascode transistors T corresponding to each other in the five amplifiers Amp 1 to Amp5. More specifically, the gate potential controller 20 applies the same gate potential to the core transistors that are always turned on, such as T1 and T3, in the five amplifiers Amp 1 to Amp5; to the signal shunting transistors, such as T10 and T30, of the differential pairs of the same gate width W; and to the signal transmitting transistors, such as T10B and T30B, of the differential pairs of the same gate width W.

As described above, only the amplifying transistor Q of one selected out of the five cascode amplifiers Amp is supplied with a constant current so that only the selected cascode amplifier Amp performs signal amplification. Therefore, even when the common gate potential is applied to the five amplifiers Amp, it causes no erroneous operation. This makes it possible to reduce the number of elements and the power consumption of the gate potential controller 20.

Figure 9:
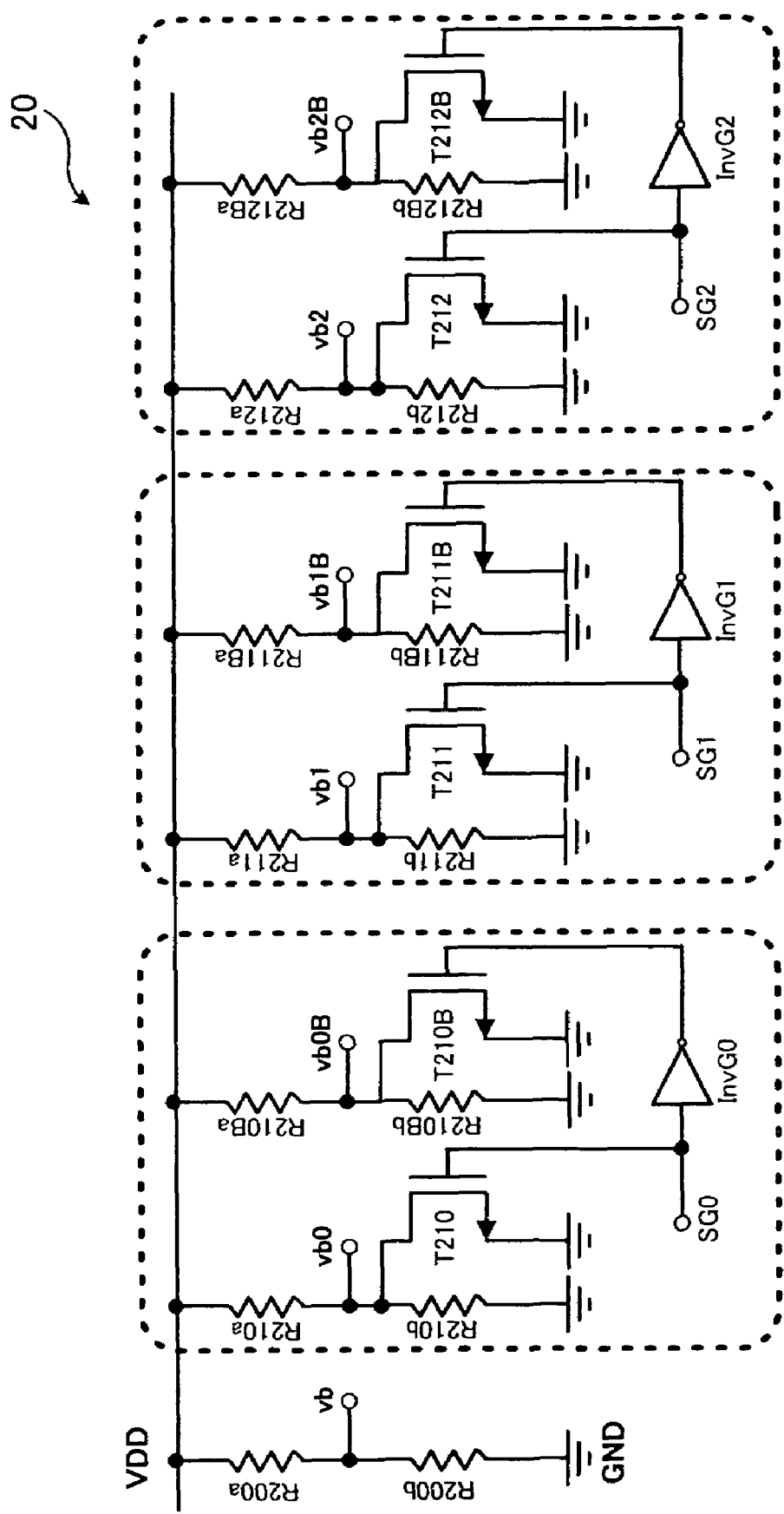
FIG. 9 is a circuit diagram showing base current control circuits by way of example.

FIG. 9 shows an example of a specific construction of the gate potential controller 20. In FIG. 9, two resistors R200a and R200b connected in series between the power supply VDD and the ground, are for dividing the power supply voltage of, for example, 2.9 V, to generate a constant potential $V_0$ of, for example, 2.4 V, lower than the power supply potential. The constant potential $V_0$ is always applied to the gate terminal vb of each core transistor, such as T1 and T3 in FIG. 2. Likewise, resistors R210a and R210b; R210Ba and R210Bb; R211a and R211b; R211Ba and R211Bb; R212a and R212b; and R212Ba and R212Bb are for applying the constant potential $V_0$ to the respective gate terminals vb0, vb0B, vb1, vb1B, vb2, and vb2B of cascode transistors T each constituting a differential pair.

Field effect transistors T210, T210B, T211, T211B, T212, and T212B are switches for setting the respective gate terminals vb0, vb0B, vb1, vb1B, vb2, and vb2B at the constant potential $V_0$ or shunting the respective gate terminals to the ground. In this embodiment, the gate terminal of the transistor T210 is connected directly to a signal input terminal SG0 while the gate terminal of the transistor T210B is connected to the signal input terminal SG0 through an inverter InvG0. Thus, one of the transistors T210 and T210B is turned on at the same time as the other is turned off. Likewise, one of the transistors T211 and T211B is turned on at the same time as the other is turned off; and one of the transistors T212 and T212B is turned on at the same time as the other is turned off.

Thus, the constant potential $V_0$ is always applied to the gate terminal vb. ON/OFF operations of the transistors T210 and T210B are switched over on the basis of the bit b0 of an input 3-bit digital signal (b2, b1, b0) so that the constant potential $V_0$ is applied to one of the gate terminals vb0 and vb0B and the other terminal is shunted to the ground. Likewise, ON/OFF operations of the transistors T211 and T211B are switched over on the basis of the bit b1 of the input digital signal so that the constant potential $V_0$ is applied to one of the gate terminals vb1 and vb1B and the other terminal is shunted to the ground. Further, ON/OFF operations of the transistors T212 and T212B are switched over on the basis of the bit b2 of the input digital signal so that the constant potential $V_0$ is applied to one of the gate terminals vb2 and vb2B and the other terminal is shunted to the ground.

According to the gate potential controller 20 thus constructed, the gate potentials of a plurality of cascode transistors T can be controlled with a relatively simple circuit construction. Therefore, reductions of the number of elements and the power consumption can be expected.

In each of the plurality of cascode transistors T, even if the same potential as the power supply VDD of, for example, 2.9 V, is applied to the base terminal of the transistor as an ON signal, the cascode transistor T can be operated. In practice, however, the constant voltage $V_0$ as the ON signal is preferably set at a lower value than the power supply potential. The reason is as follows.

In a field effect transistor, it is commonly believed that the voltage between the drain and the source when the transistor is turned on is preferably increased from the viewpoint of improvement of linearity and suppression of deterioration of linearity due to fluctuation in manufacturing process. As will be understood from FIG. 2, the drain potential of each cascode transistor T is equal to the output potential Vout. When the gate potential is Vb, equal to the constant potential $V_0$, and the potential between the gate and the source is Vgs, the source potential $Vs=Vb-Vgs=V_0-Vgs$. The gate-source potential Vgs is determined by the drain current. At this time, the drain-source voltage $Vds=Vout-Vs=Vout-V_0+Vgs$. Therefore, to increase the drain-source voltage Vds, the constant potential $V_0$ to be applied to the gate terminal of the cascode transistor T is preferably somewhat lowered. For this reason, in this embodiment, the constant potential $V_0$ is lower than the power supply potential VDD, for example, the former is 2.4 V and the latter is 2.9 V.

A characteristic feature of the LNA 1 of this embodiment as described above is to realize a wide range of gain variation and prevent deterioration of linearity due to variation of power consumption at the time of a change in gain, by keeping the current to be supplied to selected one amplifying transistor Q constant and setting the currents for the other amplifying transistors Q at zero. Focusing on this point, the performance of the LNA 1 of this embodiment was examined by simulations.

Figure 10:
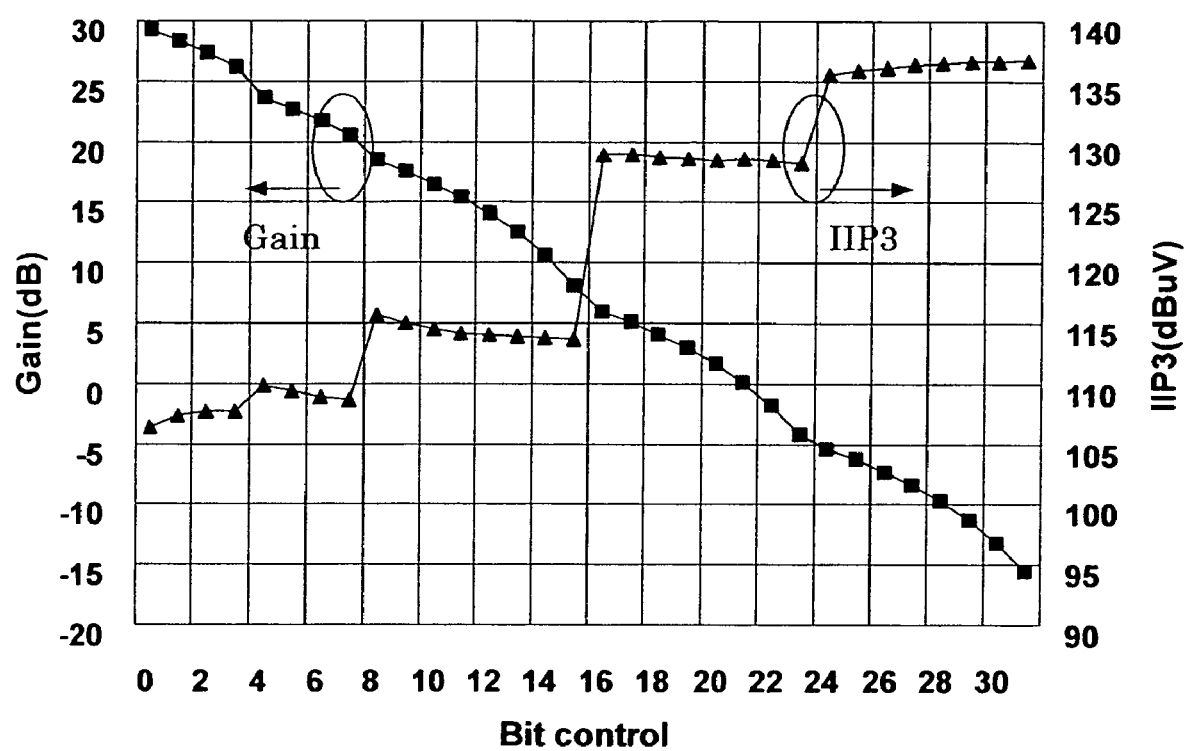
FIG. 10 is a graph showing the gain variation characteristic and the linearity IIP3 of the LNA of the embodiment.

FIG. 10 shows the gain variation value and the linearity IIP3 of the LNA 1 of this embodiment. In this embodiment, ON/OFF switching of the cascode transistors T of each cascode amplifier Amp by the gate potential controller 20 can be expressed by two bits (b1, b0) for the first- and second-stage cascode amplifiers Amp and three bits (b2, b1, b0) for the third-, fourth-, and fifth-stage cascode amplifiers Amp. Thus, the gain variation value of the whole of the LNA 1 can be expressed by 16 bits, i.e., 32 values. In FIG. 10, the values of the 16-bit control are used as the horizontal scale, and gain variation values and values of IIP3 as an index of linearity are used as vertical scales.

Figure 11:
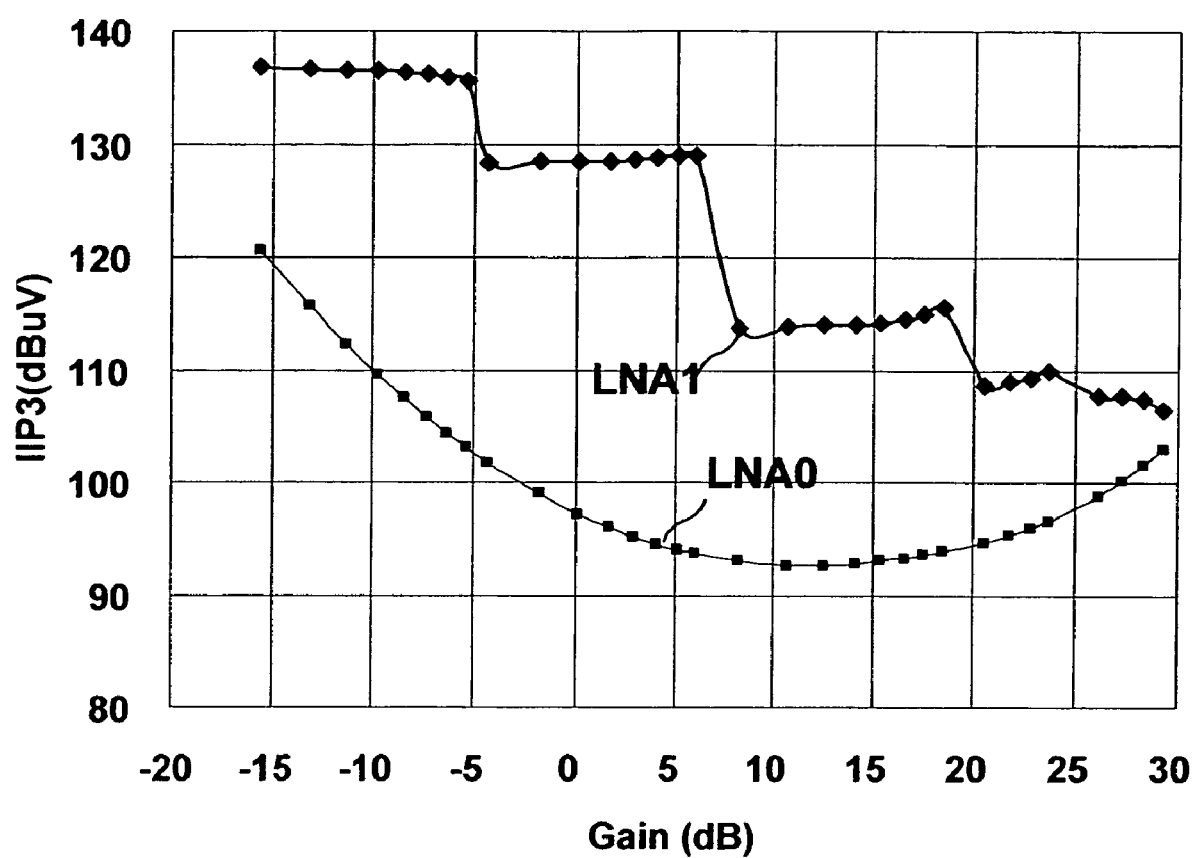
FIG. 11 is a graph showing a characteristic of linearity IIP3 to gain, of each of the LNA of the embodiment and a conventional LNA.

FIG. 11 shows a characteristic of IIP3 to gain, of the LNA 1 of this embodiment, obtained as a result of a simulation. For the purpose of comparison, FIG. 11 also shows a simulation result for a variable gain amplifier according to JP-A-2005-136846, described as a related art, in which the number of amplifying stages, i.e., the number of amplifying transistors Q, is five. The comparative example is shown as LNA 0 in FIG. 11.

As shown in FIG. 10, according to the LNA 1 of this embodiment, a gain characteristic substantially linear in decibel and a wide gain variation range of 44 dB are obtained. In addition, because a constant current Iss is always supplied to the amplifying transistor Q of each cascode amplifier Amp, the cascode amplifiers Amp are substantially constant in linearity, and it is found that the linearity scarcely changes even when ON/OFF operations are performed for a plurality of cascode transistors T. In principle, when the amplifying transistor Q is switched over to that on the subsequent stage, the linearity is improved in the degree corresponding to a decrease in gain by an attenuator AT. Thus, the linearity of the LNA 1 widely changes when the cascode amplifier Amp is switched over, and as a result, a stepwise characteristic is obtained as shown in FIG. 10.

As apparent from FIG. 10, in the LNA 1 of this embodiment, the characteristic of IIP3 does not sharply drop when the amplifying transistor Q is switched over, and thus the linearity is not deteriorated. In addition, as apparent from FIG. 11, the linearity in decreases in gain is considerably improved in comparison with the LNA 0 in which the gain is controlled by changing the quantities of current to be supplied to the amplifying transistors Q.

As described above, in the first- and second-stage cascode amplifiers Amp1 and Amp2, the number of differential pairs of cascode transistors T is small in comparison with the third- and later-stage cascode amplifiers Amp3 to Amp5, so as to narrow their gain variation ranges. This is because the gain is set generally in many cases within a range that has been attenuated by about 10 dB from the maximum gain though it is dependent on the reception environment, and the linearity in the gain range is to be improved more. That is, when the amplifying transistor Q is switched over, the linearity is improved in the degree corresponding to a decrease in gain by an attenuator AT. At this time, when the gain variation ranges in the first- and second-stage cascode amplifiers Amp1 and Amp2 are narrow, the frequency of switching over to a later-stage cascode amplifier Amp increases, and this makes it easy to obtain an effect of improvement of the linearity when switching the cascode amplifier Amp.

Further, a noise characteristic of the LNA 1 of this embodiment was also examined. Using ratios of input and output signals to noise, that is, signal-to-noise (SN) ratios, the noise can be expressed by a factor F of the following Expression 6. Further, the noise figure NF that the factor F is expressed in decibel is obtained by the following Expression 7.

$$F = \frac{(S_i/N_i)}{(S_o/N_o)} = \frac{N_o}{(S_o/S_i) \cdot N_i} = \frac{N_o}{G \cdot N_i} \quad \text{[Expression 6]}$$

$$NF(\text{dB}) = 10\log\left(\frac{N_o}{N_i}\right) - 10\log G \quad \text{[Expression 7]}$$

Figure 12:
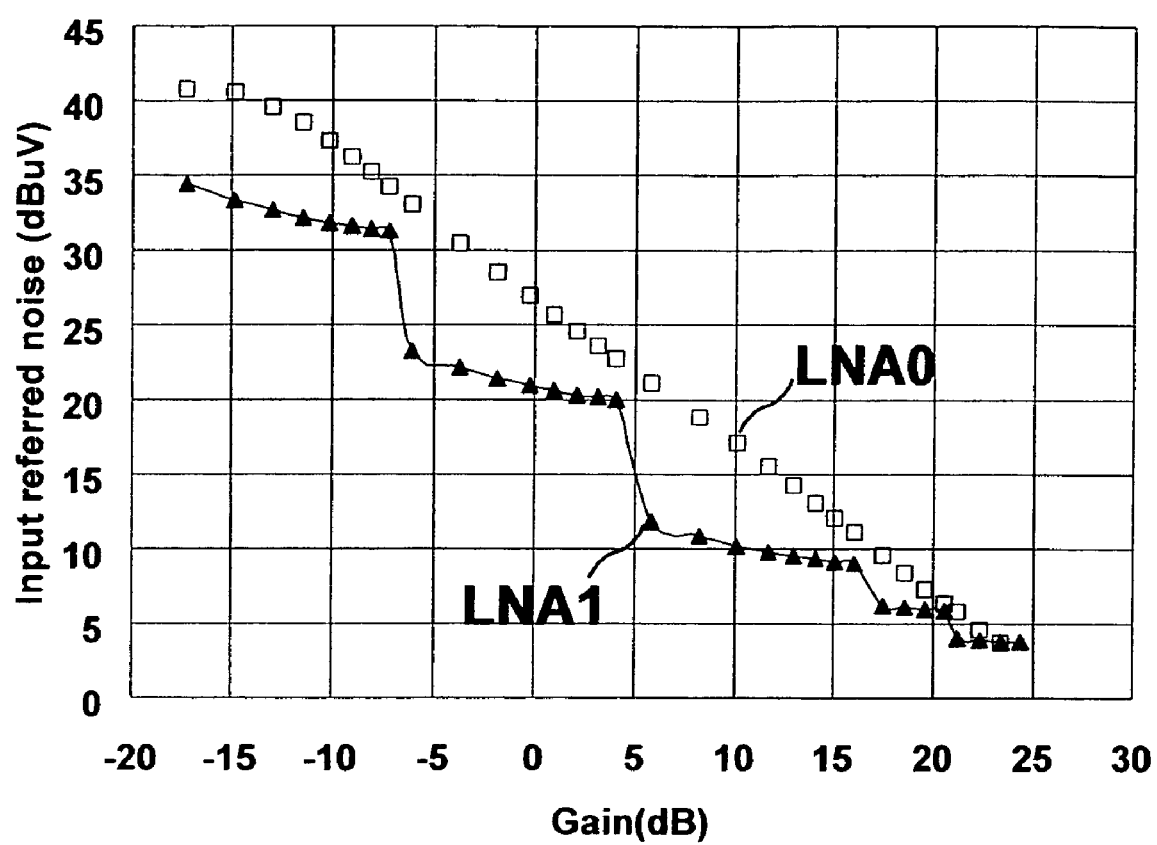
FIG. 12 is a graph showing a characteristic of noise, i.e., input referred noise voltage, to gain, of each of the LNA of the embodiment and the conventional LNA.

FIG. 12 shows a characteristic of noise, as input referred noise voltage, to gain, of the LNA 1 of this embodiment, obtained as a result of a simulation. For the purpose of comparison, FIG. 12 also shows a simulation result for a variable gain amplifier according to JP-A-2005-136846, described as a related art, in which the number of amplifying stages is five. The comparative example is shown as LNA 0 in FIG. 12.

In the LNA 1 of this embodiment, NF is deteriorated in the degree corresponding to the quantity of the decrease in gain by the attenuator AT, according to the Expression 7, when the amplifying transistor Q is switched over to that on a later stage. For example, when the second-stage amplifying transistor Q2 is turned on, NF is deteriorated by 4 dB, according to the Expression 7, because the input signal is attenuated by 4 dB by the corresponding attenuator AT. This can be confirmed in FIG. 12 from the fact that the gain decreases and the input referred noise voltage increases when switching the cascode amplifier Amp.

In the LNA 1 of this embodiment, as shown in FIG. 12, the noise characteristic is substantially kept constant while ON/OFF of cascode transistors T in each cascode amplifier Amp are being switched over to change the gain. Thus, the noise characteristic is improved in comparison with the conventional construction LNA 0, whose noise characteristic changes linearly. This is for the following reason.

The input referred noise voltage of a general common-emitter bipolar transistor is given by the following Expression 8.

$$NF(\text{lin}) = 1 + \frac{1}{Rs} \cdot \left(r_b + \frac{1}{2 \cdot gm}\right) + \frac{gm \cdot Rs}{2 \cdot \beta_0} + \frac{gm \cdot Rs}{2 \cdot \beta_h^2} \quad \text{[Expression 8]}$$

In the Expression 8, Rs: input resistance; $r_b$: base resistance; gm: transconductance of common-emitter transistor, equal to $\text{Iss}/V_T$; $\text{beta}_0$: low-frequency small-signal current amplification factor; and $\text{beta}_h$: high-frequency current amplification factor. In the Expression 8, $(r_b+1/(2\times gm))$ of the second term on the right-hand side is dominant. When it is expressed in decibel, $NF(\text{dB})=10\log(NF(\text{lin}))$.

Figure 13:
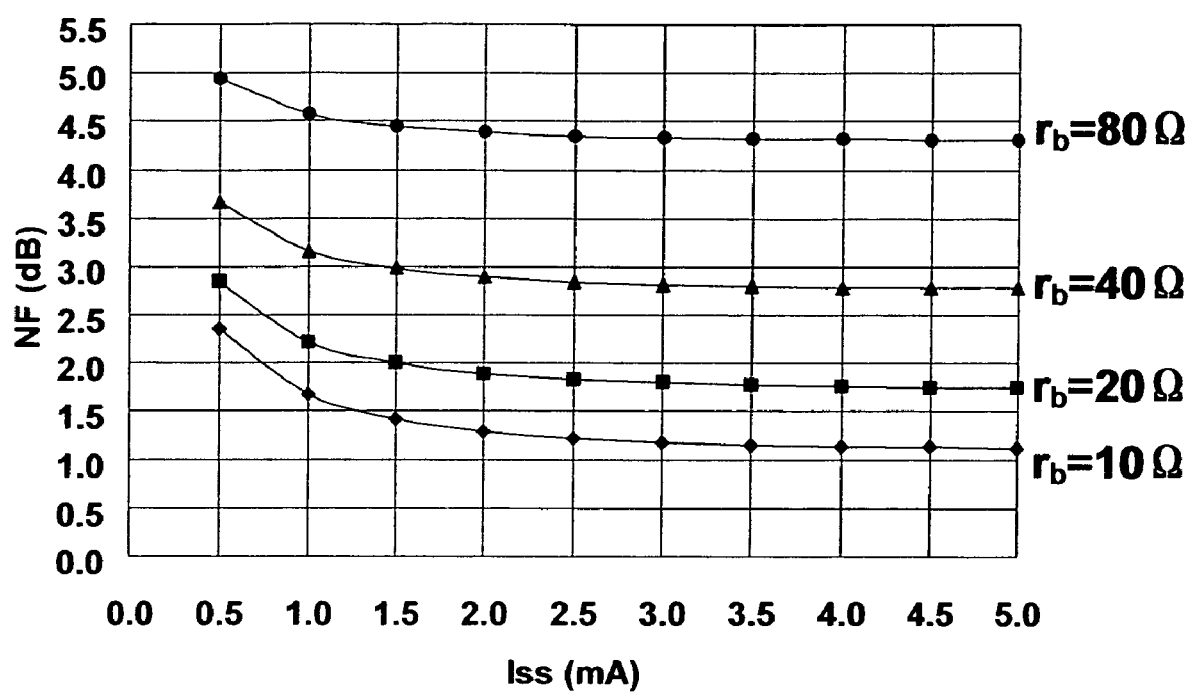
FIG. 13 is a graph showing a current dependent characteristic of noise figure NF.

FIG. 13 shows a current dependent characteristic of the NF(dB) when the base resistance rb is changed to 10, 20, 40, and 80 ohm. As the base resistance rb decreases, that is, the transistor is larger in size, NF(dB) improves. In addition, as the current Iss flowing in the transistor increases and the value of $1/(2\times gm)$ decreases, NF(dB) is improved accordingly and converges to a certain value. A certain degree of current is preferably made to flow in the bipolar transistor to decrease the contribution of current to the noise characteristic, so that $r_b$ is made larger than $1/(2\times gm)$. In this embodiment, Iss=5 mA.

In the conventional circuit construction LNA 0, whose gain is controlled by changing the quantity of current to be supplied to each amplifying transistor Q, a principal factor is noise reduction attendant upon deterioration of gain in the next-stage transistor through an attenuator AT. However, a phenomenon also should be avoided in which $(r_b+1/(2\times gm))$ in the Expression 8 increases to deteriorate the noise characteristic when the current decreases in the amplifying transistor Q to be operated. Contrastingly, in the LNA 1 of this embodiment, the deterioration of the noise characteristic can be suppressed because the current Iss to be supplied to the amplifying transistor Q is kept constant when controlling the gain. Therefore, points of expectation to improve the reception sensitivity when the gain is decreased, increases in comparison with the conventional circuit construction.

As described above, in the LNA 1 of this embodiment, five cascode amplifiers Amp are connected through attenuators AT so that the RF signal attenuated more is input to the later-stage cascode amplifier Amp. Further, the gate potential controller 20 controls ON/OFF operations of a plurality of cascode transistors T of selected one cascode amplifier Amp to change the distribution ratio alpha to the power supply VDD1, of the current Iss flowing in the amplifying transistor Q. Thus, the gain can be finely changed in a wide range.

In addition, on the basis of an instruction of the base current controller 11, the base current supply circuit 10 supplies a constant base current only to the amplifying transistor Q of the selected one cascode amplifier Amp. Thus, the current Iss flows only in the selected amplifying transistor Q, and currents never flow simultaneously in a plurality of amplifying transistors Q when switching the cascode amplifier Amp. Further, of the plurality of cascode transistors T connected to the output terminal of the amplifying transistor Q, transistors to be turned on are always kept constant in the total of W/L. Thus, the current Iss flowing in the selected amplifying transistor Q is kept constant. In addition, in each cascode amplifier Amp, because the gain is changed by ON/OFF controls of cascode transistors T, there is no transition state in which a very small current flows in a cascode transistor T when changing the gain. This makes the current density in each cascode transistor T of the LNA 1 constant so that deterioration of the linearity can be suppressed. In addition, deterioration of the noise characteristic when changing the gain can be also suppressed in comparison with the conventional circuit construction.

Each cascode amplifier Amp includes cascode transistors T that includes a plurality of differential pairs. Two transistors constituting each differential pair, for example, T30 and T30B; T31 and T31B; or T32 and T32B of the third-stage cascode amplifier Amp3, are equal to each other in size of W/L. This makes it possible to realize a compact layout of two transistors constituting each differential pair. In addition, because the two transistors are equal in characteristics, the current flowing in the core transistor that is always on, for example, T3, never changes in quantity when the ON/OFF states of the two transistors are switched over. This can further suppress the deterioration of the linearity when changing the gain.

The communication apparatus 100 including therein the LNA 1 of this embodiment can control the gain of a received RF signal in a wide range. In addition, because the deterioration of the linearity of the LNA 1, which is the first circuit of a plurality of circuit connected in a cascade arrangement, as shown in FIG. 1, is suppressed, the linearity of the whole of the communication apparatus 100 is considerably improved.

The present invention is never limited to the above-described embodiment. Appropriate modifications can be made within the scope of the invention. Next, various modifications of the embodiment will be described. In the modifications, the same components as in the embodiment are denoted by the same reference numerals as in the embodiment, respectively, to conveniently omit the description.

(1) The base potential controller is not limited to the controller in which the power supply voltage is divided by resistors, i.e., resistance division, connected in series between the power supply and the ground, as shown in FIG. 7. Any other construction can be adopted as far as it can apply one of the constant potential $V_0$ and the ground potential to the base terminal.

For example, to the amplifying transistor Q and a plurality of cascode transistors T constituting each cascode amplifier Amp of FIG. 2, replica elements reduced in size into a dozen percent to a few percent may be prepared, and a base potential controller may be made up of the replica elements. In this case, the current consumption of the circuit can be reduced attendant upon the reduction of the size of the replica elements. However, because there is a limit of the reduction of the size due to the restriction on design, the current consumption of the base potential controller is apt to increase in comparison with the above circuit of resistance division.

(2) The number of amplifying transistors Q, i.e., the number of cascode amplifiers Amp, and the number of differential pairs of cascode transistors T of each cascode amplifier Amp can be properly changed in accordance with conditions required for the LNA, such as the gain variation range. In addition, such a differential pair constituted by two cascode transistors equal in size may not always be provided. If the distribution ratio of the current flowing in the path of the signal transmitting transistors, i.e., the signal transmission path, and the path of the signal shunting transistors, i.e., the signal shunt path, can be changed without changing the current flowing in the amplifying transistor Q, another circuit construction can be adopted.

Figure 14A:
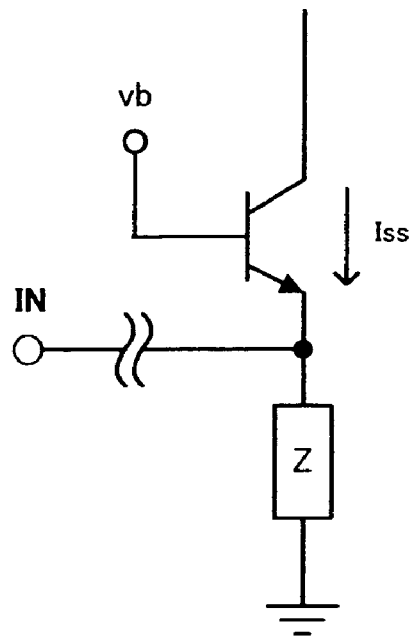
FIGS. 14A to 14D are circuit diagrams of amplifying transistors according to modifications of the embodiment.
Figure 14B:
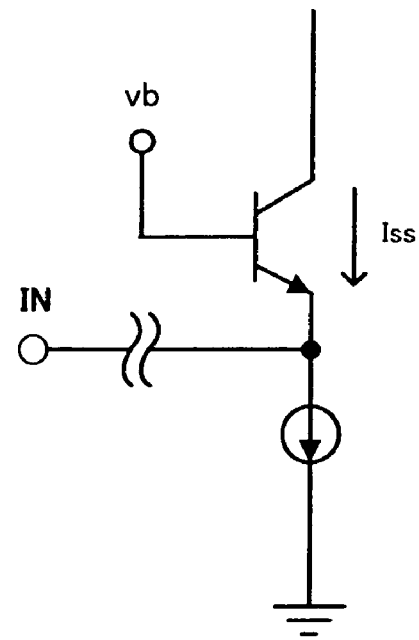
Figure 14C:
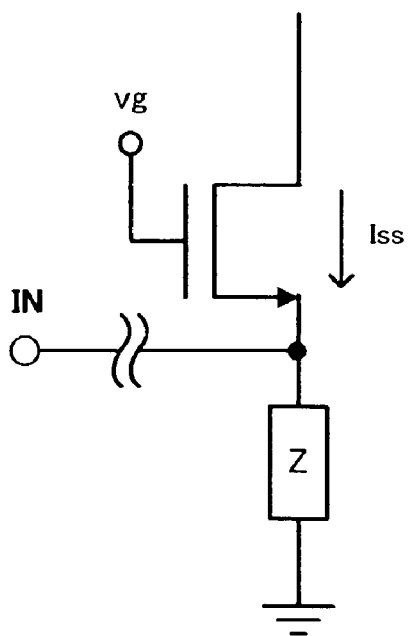
Figure 14D:
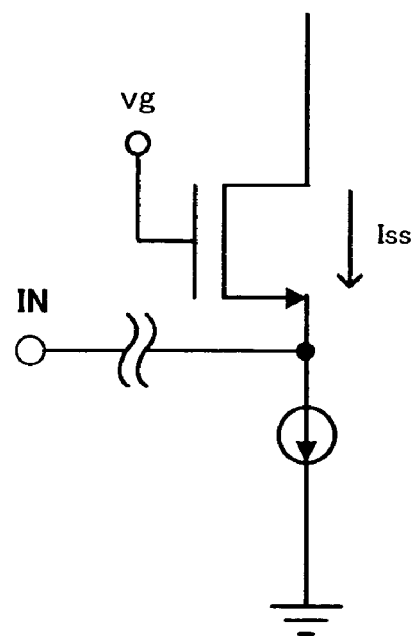

(3) Each amplifying transistor is not limited to a common-emitter bipolar transistor as described in the embodiment. For example, each amplifying transistor may be made into a common-base bipolar transistor in which its base terminal vb is fixed to a constant potential and an RF signal is input to its emitter, as shown in FIG. 14A or 14B. Otherwise, each amplifying transistor may be made into a common-gate FET in which its gate terminal vg is fixed to a constant potential and an RF signal is input to its source, as shown in FIG. 14C or 14D. In FIG. 14A or 14C, the emitter or source of the amplifying transistor is connected to an impedance element Z such as a resistor R or an inductor L. In FIG. 14B or 14D, the emitter or source of the amplifying transistor is connected to a constant current source. Also in these constructions, the current Iss to be supplied to the amplifying transistor is kept constant, and deterioration of linearity due to a decrease in power consumption can be suppressed.

(4) Application of the present invention is not limited to such an LNA. As a matter of course, the present invention can be applied to another kind of amplifier provided in a communication apparatus.

While this invention has been described in conjunction with the specific embodiments outlined above, it is evident that many alternatives, modifications and variations will be apparent to those skilled in the art. Accordingly, the preferred embodiments of the invention as set forth above are intended to be illustrative, not limiting. Various changes may be made without departing from the spirit and scope of the invention as defined in the following claims.

What is claimed is:

1. A variable gain amplifier comprising:
   a plurality of cascode amplifiers each comprising an amplifying transistor that amplifies an input signal, and a plurality of cascode transistors connected in a cascode arrangement to an output terminal of the amplifying transistor, the plurality of cascode amplifiers being connected through attenuators;
   a first controller that controls ON/OFF operations of the plurality of cascode transistors included in each cascode amplifier; and
   a second controller that controls ON/OFF operations of a plurality of amplifying transistors, only one of which is included in each of the plurality of cascode amplifiers, such that only selected one of the plurality of amplifying transistors is turned on.

2. The variable gain amplifier according to claim 1, wherein the attenuators are provided only between the plurality of cascode amplifiers.

3. The variable gain amplifier according to claim 1, wherein the plurality of cascode transistors of each cascode amplifier comprises signal transmitting transistors connected to an output load, and signal shunting transistors connected to a voltage supply terminal, and
   the first controller controls the ON/OFF operations of the plurality of cascode transistors such that the total of W/L, where W is a gate width of each cascode transistor and L is a gate length of the cascode transistor, of signal transmitting and shunting transistors to be turned on, is always constant.

4. The variable gain amplifier according to claim 3, wherein the plurality of cascode transistors of each cascode amplifier comprises:
- a first transistor as a signal transmitting transistor; and
- a differential pair constituted by a second transistor as a signal shunting transistor, and a third transistor as a signal transmitting transistor equal in W/L to the second transistor, and
- the first controller performs control such that the first transistor is always turned on, and one of the second and third transistors constituting the differential pair is turned on and the other is turned off.

5. The variable gain amplifier according to claim 4, wherein the plurality of cascode transistors of each cascode amplifier comprises a plurality of differential pairs, and
- W/L of the cascode transistors constituting each of the plurality of differential pairs is powers of two in comparison with a reference value of W/L.

6. The variable gain amplifier according to claim 5, wherein each of the plurality of cascode transistors of each cascode amplifier comprises a plurality of unit transistors equal in W and L and connected in parallel.

7. The variable gain amplifier according to claim 3, wherein the first controller applies a gate potential, which is to determine an ON/OFF operation, in common to gate terminals of corresponding cascode transistors in the plurality of cascode amplifiers.

8. The variable gain amplifier according to claim 4, wherein the first controller applies, to a gate terminal of the first transistor, a constant potential lower than a power supply potential, as an ON signal, and
- the first controller applies the constant potential as an ON signal to one of the second and third transistors, and applies a ground potential as an OFF signal to the other of the second and third transistors.

9. The variable gain amplifier according to claim 8, wherein the first controller comprises a resistor connected in series between a power source and a ground to generate the constant potential, and a switch that shunts the constant potential to the ground.

10. The variable gain amplifier according to claim 2, wherein the quantity of attenuation of each of the attenuators is set such that a maximum gain obtained by a subsequent cascode amplifier is lower than a minimum gain obtained by a preceding cascode amplifier.

11. The variable gain amplifier according to claim 1, wherein a AC-shunt capacitor is added to a gate terminal of each cascode transistor.

12. The variable gain amplifier according to claim 1, wherein the variable gain amplifier further comprises a base current supplying section that supplies a base current of a base terminal of each amplifying transistor that is made into a bipolar transistor, on the basis of an instruction from the second controller, and
- the base current supplying section comprises a constant current source and a switch that shunts the constant current source to a ground.

13. The variable gain amplifier according to claim 3, wherein the output load is connected to a first voltage supply terminal, and a drain terminal of each signal shunting transistor is connected to a second voltage supply terminal, and
- the first and second voltage supply terminals are connected to respective power sources independent of each other.

14. A communication apparatus comprising a variable gain amplifier comprising:
- a plurality of cascode amplifiers each comprising an amplifying transistor that amplifies an input signal, and a plurality of cascode transistors connected in a cascode arrangement to an output terminal of the amplifying transistor, the plurality of cascode amplifiers being connected through attenuators;
- a first controller that controls ON/OFF operations of the plurality of cascode transistors included in each cascode amplifier; and
- a second controller that controls ON/OFF operations of a plurality of amplifying transistors, only one of which is included in each of the plurality of cascode amplifiers, such that only selected one of the plurality of amplifying transistors is turned on.

* * * * *